(12) United States Patent
Nakaiso

(10) Patent No.: US 10,366,832 B2
(45) Date of Patent: Jul. 30, 2019

(54) CAPACITOR AND ELECTRONIC DEVICE HAVING A PLURALITY OF SURFACE ELECTRODES ELECTRICALLY CONNECTED TO EACH OTHER BY AN INTERMEDIATE ELECTRODE

(71) Applicant: Murata Manufacturing Co., Ltd., Nagaokakyo-shi, Kyoto-fu (JP)

(72) Inventor: Toshiyuki Nakaiso, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 8 days.

(21) Appl. No.: 15/673,598

(22) Filed: Aug. 10, 2017

(65) Prior Publication Data
US 2017/0338038 A1    Nov. 23, 2017

Related U.S. Application Data

(63) Continuation of application No. PCT/JP2016/053299, filed on Feb. 4, 2016.

(30) Foreign Application Priority Data

Feb. 27, 2015  (JP) ................................ 2015-038014

(51) Int. Cl.
*H01G 4/008* (2006.01)
*H01G 4/33* (2006.01)
(Continued)

(52) U.S. Cl.
CPC ........... *H01G 4/008* (2013.01); *H01G 4/1227* (2013.01); *H01G 4/33* (2013.01); *H01L 28/86* (2013.01);
(Continued)

(58) Field of Classification Search
CPC ........ H01G 4/008; H01G 4/1227; H01G 4/33; H01L 28/40; H05K 1/0231; H05K 1/181
See application file for complete search history.

(56) References Cited

U.S. PATENT DOCUMENTS 5,583,359 A * 12/1996 Ng ..................... H01L 23/5223
                                                      257/306
6,838,717 B1    1/2005 Yen et al.
(Continued)

FOREIGN PATENT DOCUMENTS

JP    H06-295981 A    10/1994
JP    2002-141417 A    5/2002
(Continued)

OTHER PUBLICATIONS

International Search Report issued in International Application No. PCT/JP2016/053299, dated Apr. 26, 2016.
(Continued)

*Primary Examiner* — David M Sinclair
(74) *Attorney, Agent, or Firm* — Arent Fox LLP

(57) ABSTRACT

A capacitor that includes a substrate, a first inner electrode and a second inner electrode provided above the first main surface of the substrate, the second inner electrode arranged so as to face the first inner electrode; a dielectric layer between the first inner electrode and the second inner electrode; a first intermediate electrode connected to the first inner electrode at a plurality of first locations; first surface electrodes electrically connected to the first intermediate electrode; and a second surface electrode connected to the second inner electrode at a plurality of second locations.

20 Claims, 9 Drawing Sheets

(51) Int. Cl.
   *H01G 4/12*   (2006.01)
   *H05K 1/18*   (2006.01)
   *H05K 1/02*   (2006.01)
   *H01L 49/02*  (2006.01)
   *H05K 1/11*       (2006.01)
   *H05K 1/16*       (2006.01)
   *H05K 3/46*       (2006.01)

(52) U.S. Cl.
   CPC ........... *H01L 28/90* (2013.01); *H05K 1/0231* (2013.01); *H05K 1/181* (2013.01); *H05K 1/111* (2013.01); *H05K 1/162* (2013.01); *H05K 3/4644* (2013.01); *H05K 2201/10015* (2013.01)

(56) References Cited

U.S. PATENT DOCUMENTS

| | | | |
|---|---|---|---|
| 7,187,026 | B2 | 3/2007 | Kiyotoshi |
| 7,196,898 | B2 | 3/2007 | Osaka et al. |
| 7,312,118 | B2 | 12/2007 | Kiyotoshi |
| 7,836,567 | B2 | 11/2010 | Osaka et al. |
| 7,898,792 | B2 | 3/2011 | Takeshima et al. |
| 8,314,474 | B2 | 11/2012 | McLellan et al. |
| 8,343,361 | B2 | 1/2013 | Takeshima et al. |
| 8,390,982 | B2 | 3/2013 | Takeshima et al. |
| 2004/0130849 | A1 | 7/2004 | Kurihara et al. |
| 2004/0152258 | A1 | 8/2004 | Kiyotoshi |
| 2004/0190218 | A1* | 9/2004 | Li ............... H01G 4/232 361/302 |
| 2005/0111162 | A1 | 5/2005 | Osaka et al. |
| 2006/0138595 | A1 | 6/2006 | Kiyotoshi |
| 2006/0180938 | A1* | 8/2006 | Kurihara ......... H01L 21/4853 257/773 |
| 2006/0250749 | A1 | 11/2006 | Kurihara et al. |
| 2007/0025057 | A1* | 2/2007 | Togashi ............. H01G 4/232 361/307 |
| 2007/0076348 | A1* | 4/2007 | Shioga .............. H01G 4/232 361/307 |
| 2007/0139859 | A1 | 6/2007 | Osaka et al. |
| 2008/0032481 | A1 | 2/2008 | Kiyotoshi |
| 2008/0186654 | A1 | 8/2008 | Takeshima et al. |
| 2010/0019347 | A1 | 1/2010 | McLellan et al. |
| 2010/0252527 | A1 | 10/2010 | Takeshima et al. |
| 2011/0110016 | A1 | 5/2011 | Takeshima et al. |
| 2012/0074521 | A1* | 3/2012 | Imanaka ............. B82Y 30/00 257/532 |
| 2013/0038981 | A1* | 2/2013 | Imanaka ........... H01G 4/1227 361/301.4 |
| 2013/0088811 | A1 | 4/2013 | Takeshima et al. |

FOREIGN PATENT DOCUMENTS

| | | | |
|---|---|---|---|
| JP | 2004-179419 A | 6/2004 | |
| JP | 2004-214589 A | 7/2004 | |
| JP | 2005-159259 A | 6/2005 | |
| JP | 2009-9984 A | 1/2009 | |
| JP | 2010-283378 A | 12/2010 | |
| JP | 2011-529263 A | 12/2011 | |
| WO | WO 2007/046173 A1 | 4/2007 | |
| WO | WO 2009/078225 A1 | 6/2009 | |
| WO | WO-2016158228 A1 * | 10/2016 | ............... H01G 4/33 |

OTHER PUBLICATIONS

Written Opinion of the International Searching Authority issued in International Application No. PCT/JP2016/053299, dated Apr. 26, 2016.

* cited by examiner

FIG. 10
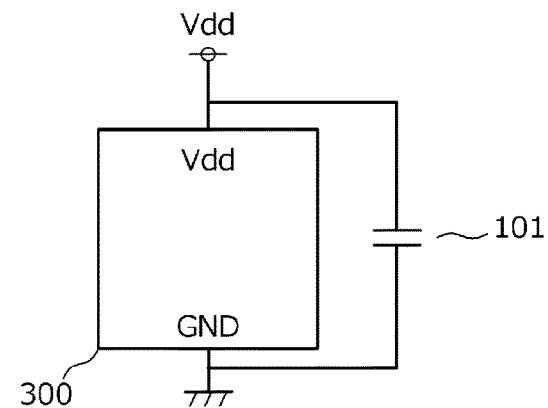
FIG. 11 – PRIOR ART
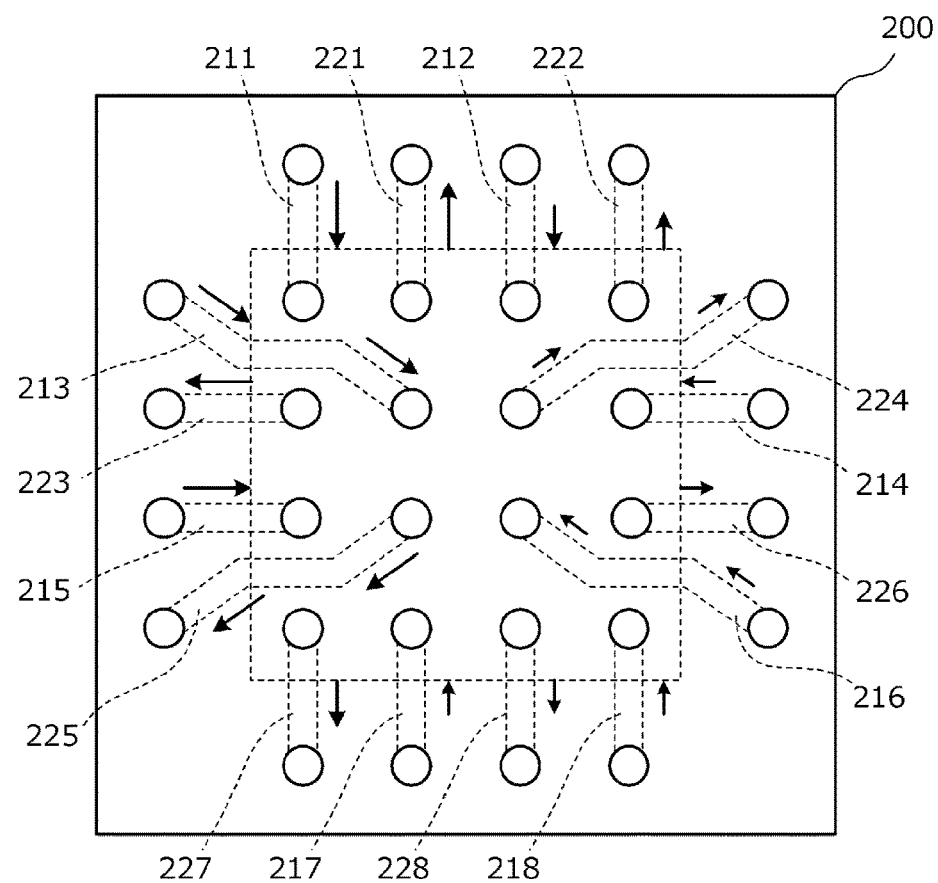

CAPACITOR AND ELECTRONIC DEVICE HAVING A PLURALITY OF SURFACE ELECTRODES ELECTRICALLY CONNECTED TO EACH OTHER BY AN INTERMEDIATE ELECTRODE

CROSS REFERENCE TO RELATED APPLICATIONS

The present application is a continuation of International application No. PCT/JP2016/053299, filed Feb. 4, 2016, which claims priority to Japanese Patent Application No. 2015-038014, filed Feb. 27, 2015, the entire contents of each of which are incorporated herein by reference.

FIELD OF THE INVENTION

The present invention relates to a capacitor that is suitable for realizing low ESR and low ESL, and to an electronic device into which the capacitor is incorporated.

BACKGROUND OF THE INVENTION

Generally, a decoupling capacitor is connected between a power supply line and ground with the aim of avoiding superposition of voltage fluctuations of a direct-current power supply and noise in an electronic circuit.

In such a decoupling application, low equivalent series resistance (ESR) is demanded, and in particular, from the viewpoint of eliminating noise in a high-frequency range of over 100 MHz, for example, very low equivalent series inductance (ESL) is demanded.

An effective way of reducing ESR and ESL is to arrange terminals of different polarities (first surface electrodes and second surface electrodes) in a planar grid-like pattern, as described in Patent Document 1 for example. As a result, the number of current paths having a parallel relationship is increased, and ESR is consequently reduced. In addition, the directions of currents that flow through upper and lower electrodes sandwiching a dielectric layer therebetween and the directions of currents that flow through conductors that extend in the stacking direction are respectively opposite to each other, and as a result, generation of magnetic fields is suppressed. Therefore, ESL is reduced. Furthermore, the overall current path is shortened, and consequently, ESR and ESL are reduced.

Patent Document 1: International Publication No. 2007/046173

SUMMARY OF THE INVENTION

In the capacitor of the related art in which surface electrodes of different polarities are arranged in a planar grid-like pattern as described in Patent Document 1, the directions of currents that flow into and out of the plurality of surface electrodes (outer terminals) are determined by the circuit pattern on the substrate to which the capacitor is connected. The directions of the currents will be described while referring to FIG. 11. FIG. 11 illustrates an example configuration of circuit-board-side mounting electrodes with which the capacitor described in Patent Document 1 is mounted. In FIG. 11, currents that flow through wiring lines 211, 212, 213 . . . 218 flow into the capacitor, whereas currents that flow out of the capacitor flow through wiring lines 221, 222, 223 . . . 228.

In FIG. 11, if there is a power-source-voltage supply source or a noise source located at the top left for example, the currents that flow into and out of the capacitor by flowing through the wiring lines 211, 212, 213, 215 and so on and the wiring lines 221, 223 and so on that are close to the top left will be larger than the currents that flow into and out of the capacitor through the other wiring lines. In other words, a region in which the current strength is high in inner electrodes that sandwich a dielectric layer therebetween is biased toward the top left in FIG. 11. Thus, when the current distribution becomes non-uniform, the effect realized by providing a plurality of first surface electrodes and a plurality of second surface electrodes is reduced, and the effective ESR and ESL are degraded.

An object of the present invention is to provide a capacitor that more effectively reduces ESR and ESL by making further improvements to the shapes and arrangements of conductor portions, and to provide an electronic device that incorporates the capacitor.

A capacitor according to an embodiment of the present invention includes:

a substrate having a first main surface;

a first inner electrode and a second inner electrode that are provided above the first main surface (with nothing or an insulating layer interposed therebetween), the second inner electrode being arranged so as to face the first inner electrode;

a dielectric layer that is provided between the first inner electrode and the second inner electrode;

a first intermediate electrode that is provided above the first inner electrode and the second inner electrode, and that is connected to the first inner electrode at a plurality of first locations; and first surface electrodes that are provided above the first intermediate electrode and are connected to the first intermediate electrode, and a second surface electrode that is provided above the first intermediate electrode and is electrically connected to the second inner electrode at a plurality of second locations.

With the above-described configuration, the first surface electrodes are connected to each other by the first intermediate electrode, and therefore the effect of the directions of currents flowing into and out of the first surface electrodes is reduced. In other words, biasing (skewing) of the potential of the first surface electrodes is reduced by the first intermediate electrode, and therefore the concentration of current within the plane of the first inner electrode is reduced. Consequently, ESL and ESR are reduced. In addition, the number of current paths having a parallel relationship among current paths from the first inner electrode to the first surface electrodes is increased, and ESL and ESR are reduced even more.

Preferably, the first inner electrode and the second inner electrode have substantially the same outer shape, and the first intermediate electrode is electrically connected to the first inner electrode via respective openings in the second inner electrode. With this configuration, the path lengths of conductors that connect the first inner electrode and the first intermediate electrode to each other are reduced, and an increase in the lengths of paths from the first inner electrode to the first surface electrodes in a thickness direction is suppressed.

The capacitor further preferably includes a second intermediate electrode that is provided above the first inner electrode and the second inner electrode, and that is connected to the second inner electrode at a plurality of third locations. With this configuration, biasing (skewing) of the potential of the second surface electrode or the second inner electrode is reduced by the second intermediate electrode, and therefore the concentration of current within the planes of the second surface electrode and the second inner electrode is reduced. Consequently, ESL and ESR are reduced. In addition, the number of current paths having a parallel relationship among current paths from the second inner electrode to the second surface electrode is increased, and consequently ESL and ESR are reduced even more.

Preferably, the second intermediate electrode is surrounded by the first intermediate electrode within a first common plane, and the first surface electrodes are surrounded by the second surface electrode within a second common plane (e.g., a plane of the second surface electrode). With this configuration, the current that flows in the first inner electrode, the second inner electrode and the second surface electrode is distributed in the planar directions by using a small number of layers.

The first surface electrodes preferably form a planar grid-like pattern in which the first surface electrodes are arranged so as to alternate with the second surface electrode in vertical and horizontal directions. With this configuration, the current is effectively dispersed by the first intermediate electrode and the second surface electrode.

The first intermediate electrode preferably has a lower sheet resistance than the first inner electrode. With this configuration, electrode materials can be used that are suitable for the first inner electrode and the second inner electrode, which are electrodes that sandwich a dielectric layer therebetween, and a capacitor having a small equivalent series resistance (ESR) can be formed.

The substrate is also preferably a semiconductor substrate, and the first inner electrode, the second inner electrode, the first intermediate electrode, the first surface electrodes and the second surface electrode are metal thin films formed using a thin film process. With this configuration, a capacitor that is small in size and has a large capacitance can be obtained.

It is also preferable that the dielectric layer be a thin film layer composed of a material having a high dielectric constant such as $(Ba_xSr_{1-x})TiO_3$. With this configuration, advantage is taken of a high dielectric constant, and a capacitor can be formed that has a high capacitance while being small in size.

The first inner electrode and the second inner electrode are preferably formed of a metal having Pt as a main component. With this configuration, a BST thin film layer can be fired at a high temperature of around 800-1000° C. in an oxidizing atmosphere.

It is preferable that the first intermediate electrode and the second intermediate electrode be formed of a metal having Cu or Al as a main component. With this configuration, a low ESR can be achieved while using an electrode material that is suitable for the first inner electrode and the second inner electrode, which are electrodes that sandwich a dielectric layer therebetween.

It is also preferable that the first surface electrodes and the second surface electrode be each provided, on a surface thereof, with a metal film having Cu as a main component. With this configuration, the environmental resistance of terminal electrodes is increased.

An electronic device of the present invention includes the capacitor set forth above; and a circuit board on which the capacitor is mounted. The circuit board includes first mounting electrodes and second mounting electrodes to which the first surface electrodes and the second surface electrode of the capacitor respectively connected thereto.

With this configuration, it is possible to form an electronic device that includes a capacitor having low ESL and ESR.

For example, the electronic device further includes an integrated circuit and a power supply circuit are provided in or on the circuit board. The power supply circuit supplies a power supply voltage to the integrated circuit, and the capacitor is a decoupling capacitor that is connected between a power supply terminal of the integrated circuit and ground. With this configuration, it is possible to form an electronic device in which a noise component and a voltage fluctuation component that are applied to a power supply terminal of an integrated circuit are suppressed.

According to the present invention, even when the currents that flow into and out of the first surface electrodes and the second surface electrode of the capacitor are not uniform due to for example the circuit pattern on the substrate to which the capacitor is connected, it is possible to suppress degradation of the ESL and ESR caused by such non-uniformity. Furthermore, it is possible to form an electronic device into which a low ESL/ESR capacitor is incorporated as a decoupling capacitor, for example.

BRIEF DESCRIPTION OF THE DRAWINGS

FIG. 10 illustrates an example of connection of the capacitor 101 to a circuit to which the capacitor 101 is applied.

FIG. 11 illustrates an example configuration of circuit-board-side mounting electrodes on which a capacitor described in Patent Document 1 is mounted.

DETAILED DESCRIPTION OF THE PREFERRED EMBODIMENTS

Figure 1:
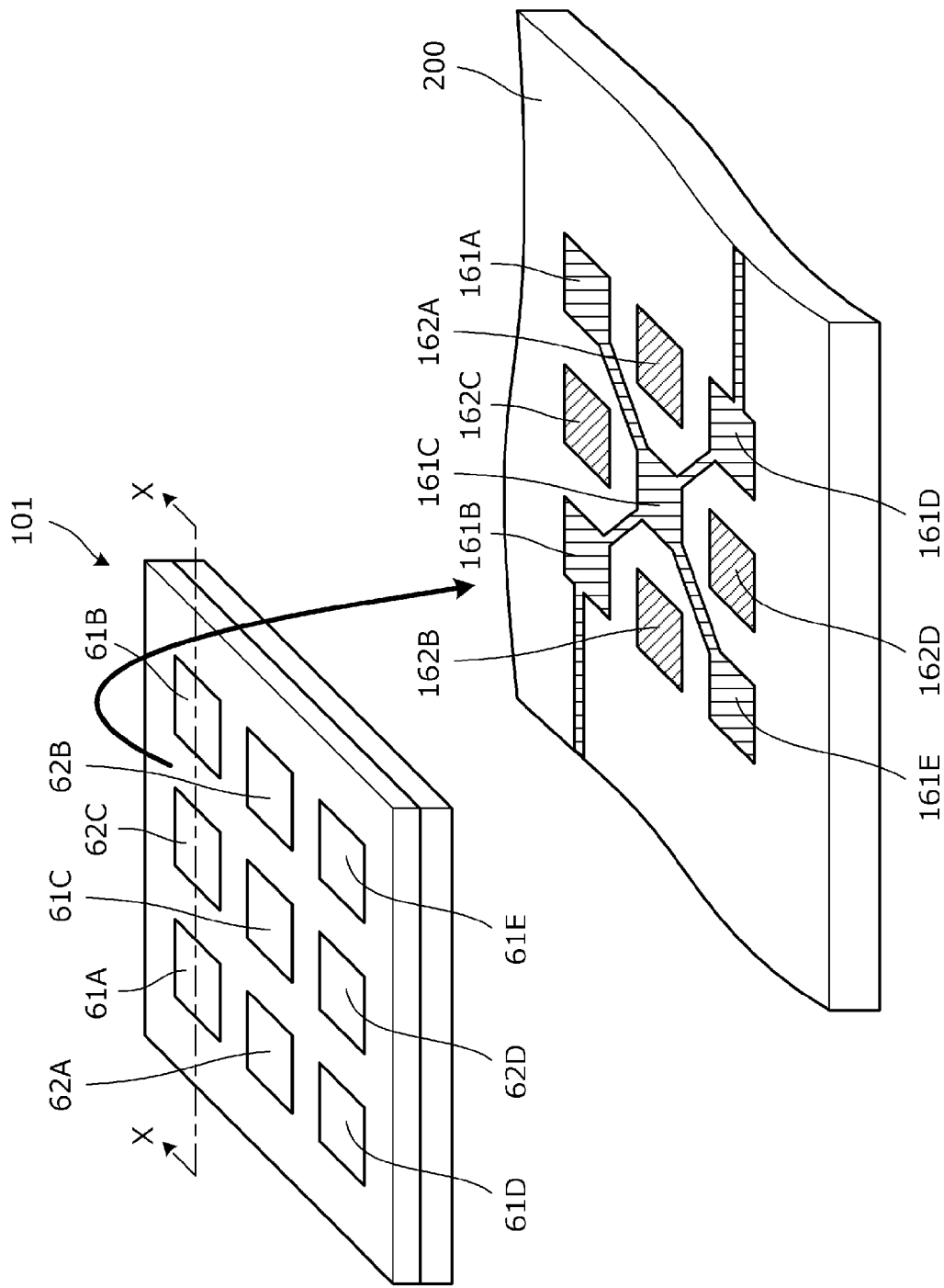
FIG. 1 is a perspective view of a capacitor 101 according to a first embodiment and a circuit board on which the capacitor 101 is to be mounted.

Hereafter, a plurality of modes for carrying the present invention will be described by giving a number of specific examples while referring to the drawings. Like symbols denote like portions in the drawings. In the second embodiment and embodiments thereafter, description of matters common to the first embodiment will be omitted and only the differences will be described. In particular, the same operational effects resulting from the same configurations will not be repeatedly described in the individual embodiments.

First Embodiment

FIG. 1 is a perspective view of a capacitor 101 according to a first embodiment and a circuit board on which the capacitor 101 is to be mounted.

In FIG. 1, a surface of the capacitor 101 that is mounted on a circuit board 200 (mounting surface) is illustrated as an upper surface. The capacitor 101 includes first terminal electrodes 61A, 61B, 61C, 61D and 61E, and second terminal electrodes 62A, 62B, 62C and 62D. The plurality of first terminal electrodes 61A, 61B, 61C, 61D and 61E are input/output terminals of the same potential (for example, positive electrode terminals), and the plurality of second terminal electrodes 62A, 62B, 62C and 62D are input/output terminals of the same potential (for example, negative electrode terminals). These terminal electrodes form LGA-type terminal electrodes. The first terminal electrodes 61A, 61B, 61C, 61D and 61E are an example of "first surface electrodes" of the present invention. The second terminal electrodes 62A, 62B, 62C and 62D are an example of "second surface electrodes" of the present invention.

The capacitor 101 is an element that has a prescribed capacitance between the first terminal electrodes 61A, 61B, 61C, 61D and 61E and the second terminal electrodes 62A, 62B, 62C and 62D, and is used as a decoupling capacitor, for example.

First mounting electrodes (lands) 161A, 161B, 161C, 161D and 161E and second mounting electrodes (lands) 162A, 162B, 162C and 162D are formed on the circuit board 200. The first terminal electrodes 61A, 61B, 61C, 61D and 61E and the second terminal electrodes 62A, 62B, 62C and 62D of the capacitor 101 have shapes that respectively correspond to those of the first mounting electrodes 161A, 161B, 161C, 161D and 161E and the second mounting electrodes 162A, 162B, 162C and 162D on the circuit board 200, and the terminal electrodes are respectively connected to the corresponding mounting electrodes through a conductive bonding material.

The plurality of first mounting electrodes 161A, 161B, 161C, 161D and 161E are connected to each other on the surface of the circuit board 200 via connection conductors, and are at the same potential. In addition, the plurality of second mounting electrodes 162A, 162B, 162C and 162D are connected to each other via connection conductors in an inner layer of the circuit board 200, and are at the same potential.

A solder resist may be patterned so as to cover the connection conductors on the surface of the circuit board 200. The circuit board 200 may be a printed wiring board provided in any of a variety of electronic devices, or may be an interposer that is for mounting a semiconductor integrated circuit chip on another substrate.

Figure 2:
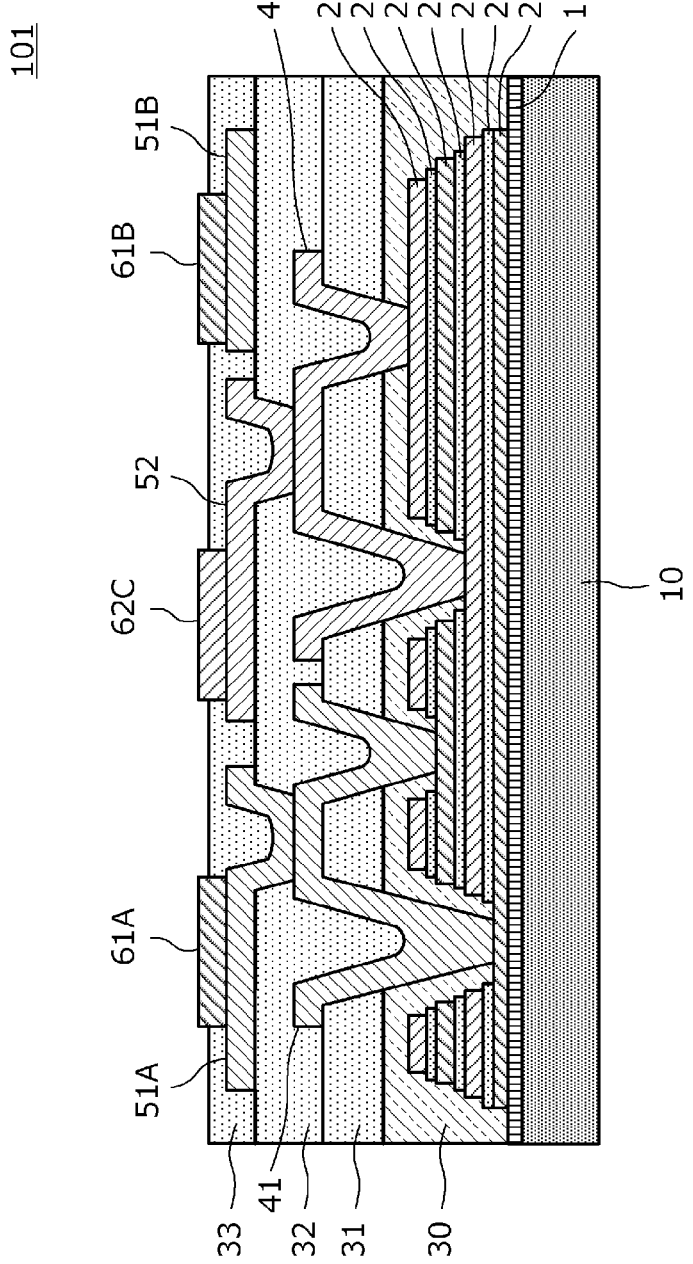
FIG. 2 is a sectional view taken along X-X in FIG. 1.

FIG. 2 is a sectional view taken along X-X in FIG. 1.

Hereafter, the configuration of the capacitor 101 of this embodiment is described using the symbols denoting the parts illustrated in FIG. 2.

The capacitor 101 includes a substrate 10 having a first main surface, and an adhesive layer 11 formed on the first main surface of the substrate 10. First inner electrodes 21A and 21B and second inner electrodes 22A and 22B are provided above the first main surface and the adhesive layer 11, and second inner electrodes 22A and 22B are arranged so as to face the first inner electrodes 21A and 21B. Dielectric layers 20A, 20B and 20C are provided between the first inner electrodes 21A and 21B and the second inner electrodes 22A and 22B. A first intermediate electrode 41 is provided above the first inner electrodes 21A and 21B and the second inner electrodes 22A and 22B, and is connected to the first inner electrodes 21A and 21B at a plurality of locations. First surface electrodes 51A and 51B are provided above the first intermediate electrode 41 and are connected to the first intermediate electrode 41, and a second surface electrode 52 is provided above the first intermediate electrode 41 and is electrically connected to the second inner electrodes 22A and 22B at a plurality of locations.

In addition, in this embodiment, a second intermediate electrode 42C is provided above the first inner electrodes 21A and 21B and the second inner electrodes 22A and 22B, and is connected to the second inner electrodes 22A and 22B at a plurality of locations. The second surface electrode 52 is connected to the second intermediate electrode 42C.

The plurality of first terminal electrodes 61A, 61B, 61C, 61D and 61E are formed on upper surfaces of the first surface electrodes 51A and 51B (the first terminal electrodes 61A and 61B are illustrated in FIG. 2), and the plurality of second terminal electrodes 62A, 62B, 62C and 62D are formed on an upper surface of the second surface electrode (the second terminal electrode 62C is illustrated in FIG. 2).

An inorganic insulating layer 30 covers a multilayer body part constituted by the first inner electrodes 21A and 21B, the second inner electrodes 22A and 22B and the dielectric layers 20A, 20B and 20C. A first organic protecting layer 31 covers the inorganic insulating layer 30, and the first intermediate electrode 41 and the second intermediate electrode 42C are formed thereon. A second organic protecting layer 32 covers the first organic protecting layer 31, and the first surface electrode 51A and the second surface electrode 52 are formed therein, and a third organic protecting layer 33 covers the second organic protecting layer 32, and allows the first terminal electrodes 61A and 61B, the second terminal electrode 62C and so on to be exposed therethrough.

In FIG. 2, a first capacitor part is formed by the first inner electrode 21A, the second inner electrode 22A and the dielectric layer 20A, a second capacitor part is formed by the first inner electrode 21B, the second inner electrode 22A and the dielectric layer 20B, and a third capacitor part is formed by the first inner electrode 21B, the second inner electrode 22B and the dielectric layer 20C.

The plurality of first surface electrodes (51A, 51B, etc.) are connected to each other by the first intermediate electrode 41. Therefore, the effect of the directions of the currents flowing into and out of the first terminal electrodes (61A, 61B, etc.) (directional dependence) is reduced. In other words, since biasing (skewing) of the potential of the first surface electrodes is reduced by the first intermediate electrode 41, the concentration of current within the planes of the first inner electrodes 21A and 21B is reduced. Consequently, ESL and ESR are reduced. In addition, the number of current paths having a parallel relationship among current paths from the first inner electrodes 21A and 21B to the first surface electrodes 51A, 51B and so on is increased, and ESL and ESR are reduced even more.

For example, as illustrated in FIG. 10, the capacitor of the present invention (the capacitor 101 of this embodiment) is used a decoupling capacitor (bypass capacitor) that is connected to points close to a power supply terminal Vdd and a ground terminal GND of a semiconductor integrated circuit 300.

Hereafter, a method of manufacturing the capacitor 101 will be sequentially described while referring to FIG. 2.

The substrate 10 is a semiconductor substrate or an insulator substrate, and, as a representative example, is a Si substrate having a $SiO_2$ film formed on a surface thereof. A $(Ba_xSr_{1-x})TiO_3$ film (hereafter, "BST film") is formed on the substrate 10 as the adhesive layer 11.

A Pt electrode film, which will form the first inner electrode 21A, a BST film, which will form the dielectric layer 20A, and a Pt electrode film, which will form the second inner electrode 22A, are sequentially formed on the surface of the adhesive layer 11 (BST film). Similarly, a BST film, which will form the dielectric layer 20B, and a Pt electrode film, which will form the first inner electrode 21B, are sequentially formed, and a BST film, which will form the dielectric layer 20C, and a Pt electrode film, which will form the second inner electrode 22B, are sequentially formed.

For example, the BST films are formed by performing a spin coating process and a firing process, and the Pt electrode films are deposited using a sputtering method. The adhesive layer 11 may be formed of a film other than a BST film provided that the film acts as an adhesive layer for improving the adhesion of an electrode film to a $SiO_2$ insulating film. Furthermore, the adhesive layer 11 does not necessarily have to be provided. In addition, another high-melting point noble metal material that has good conductivity and good oxidation resistance such as Au may be used for the electrode films.

A $SiO_2$ film, which will form the inorganic insulating layer 30, is formed using a CVD method or a sputtering method, and a polybenzoxazole (PBO) film, which will form the first organic protective layer 31, is formed by applying a PBO film to the top of the $SiO_2$ film using an automatic coater or the like and firing the PBO film. Then, openings that will serve as contact holes are formed in the $SiO_2$ film by performing inductive coupling plasma reactive ion etching (ICP-RIE), for example. In addition, the inorganic insulating layer is not limited to being formed of $SiO_2$, and the first organic protective layer is not limited to being formed of a PBO film.

A Ti/Cu/Ti film with layer thicknesses of 0.1 μm/1.0 μm/0.1 μm, for example, is deposited inside the openings and on the surface of the PBO film using a sputtering method or the like.

The first intermediate electrode 41, the second intermediate electrode 42C and so on are formed by patterning the Ti/Cu/Ti film. The intermediate electrodes are not limited to being Ti/Cu/Ti films formed using a sputtering method, and a Cu film or the like formed using a plating method may be used instead, for example.

A PBO film, which will form the second organic protective layer 32, is formed by applying a PBO film to the top of the intermediate electrodes using an automatic coater or the like and firing the PBO film. The second organic protective layer is not limited to being a PBO film.

A Ti/Cu/Ti film with layer thicknesses of 0.1 μm/1.0 μm/0.1 μm, for example, is deposited inside the openings and on the surface of the PBO film using a sputtering method or the like.

The first surface electrodes 51A and 51B and so on, and the second surface electrode 52 are formed by patterning the Ti/Cu/Ti film. The surface electrodes are not limited to being Ti/Cu/Ti films formed using a sputtering method, and a Cu film or the like formed using a plating method may be used instead, for example.

A solder resist film is applied and formed as the third organic protective layer 33.

The first terminal electrodes 61A, 61B and so on, and the second terminal electrode 62C and so on, the surfaces of which are plated with Ni and Au, are formed by forming openings in the solder resist film, plating the insides of the openings with Ni and then performing Au plating. The plating films are not limited to being Ni and Au plating films, and may be Ni and Sn plating films or the like instead.

Thus, the capacitor of this embodiment is a thin film capacitor formed using a thin film process. Provided that the first intermediate electrode 41 and the second intermediate electrode 42C and so on of the thin film capacitor are formed using a high-melting point metal having Pt has a main component, the BST, which is a high dielectric constant material forming the dielectric layers 20A, 20B and 20C, can be fired at a high temperature of around 800-1000° C. in an oxidizing atmosphere.

Provided that the first intermediate electrode 41, the second intermediate electrode 42C and so on are formed of a material having a small resistivity such as a metal film having Cu as a main component, and that the film thicknesses thereof are made large, the sheet resistances thereof can be made lower than those of the first inner electrodes (Pt). The first intermediate electrode 41, the second intermediate electrode 42C and so on may be formed of a metal having Al as a main component rather than Cu. Thus, the capacitor can be made to have low ESR while using suitable electrode materials for the first inner electrodes 21A and 21B and the second inner electrodes 22A and 22B, which are electrodes that sandwich the dielectric layers 20A and 20B therebetween.

In addition, since the substrate 10 is a semiconductor substrate, and the first inner electrodes, the second inner electrodes, the first intermediate electrode, and the first surface electrodes and the second surface electrodes are metal thin films that are formed using a thin film process, a capacitor that has a small size and a large capacitance can be obtained.

Furthermore, in this embodiment, the first terminal electrodes 61A, 61B and so on and the second terminal electrodes 62C and so on, which are formed of Ni and Au plating films, are formed on the first surface electrodes 51A, 51B and so on and the second surface electrode 52, and therefore the terminal electrodes have a high environment resistance.

According to this embodiment, the outer shapes of the first inner electrodes 21A and 21B and the second inner electrodes 22A and 22B are substantially the same as each other, and the first intermediate electrode 41 is electrically connected to the first inner electrodes 21A and 21B via the openings provided in the second inner electrodes 22A and 22B, and therefore the path lengths of conductors that connect the first inner electrodes 21A and 21B and the first intermediate electrode 41 to each other are short, and an increase in the length of paths from the first inner electrodes 21A and 21B to the first surface electrodes 51A, 51B and so on in the thickness direction is suppressed.

Furthermore, the first surface electrodes 51A and 51B are arranged in a planar grid-like pattern so as to alternate with the second surface electrode 52 in the vertical and horizontal directions. Thus, current is effectively dispersed by the first intermediate electrode 41 and the second surface electrode 52.

Although a case in which there are 3×3 making a total of 9 of each of the terminal electrodes of the capacitor and the mounting electrodes of the circuit board has been exemplified, for example, a configuration in which there are 2×2 making a total of 4, or 5×5 making a total of 25 of each type of electrode may be adopted instead. The number is not limited to being a square number.

Second Embodiment

In a second embodiment, an example of a capacitor that includes not just a first intermediate electrode but also second intermediate electrodes will be described.

Figure 3A:
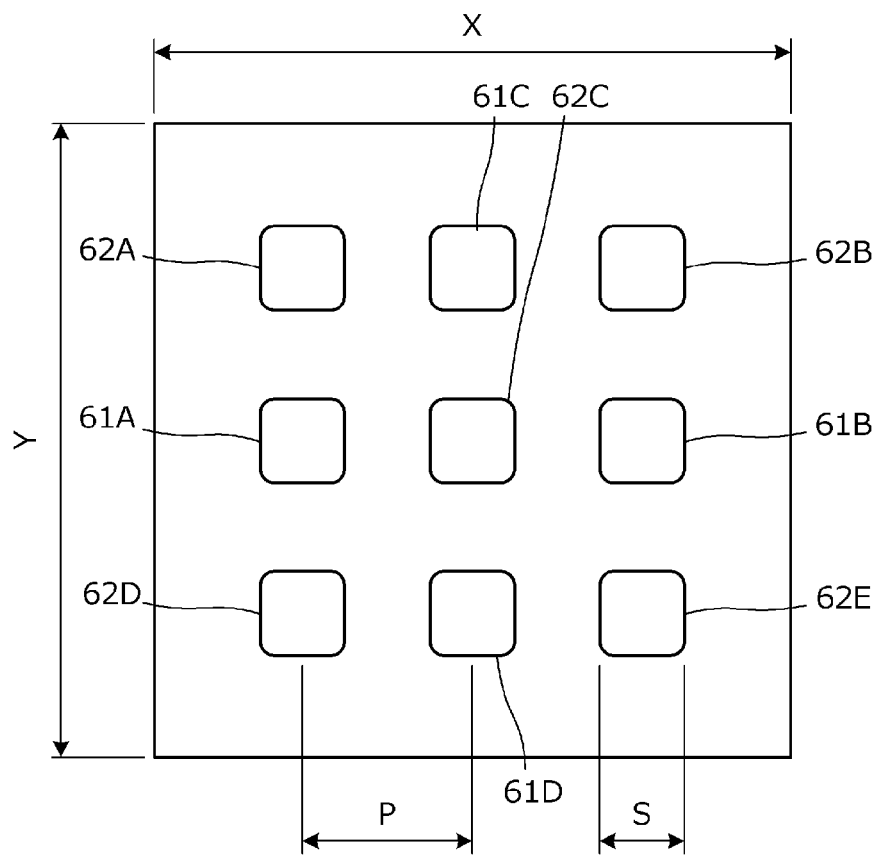
FIG. 3(A) is a plan view of a capacitor 102 according to a second embodiment.
Figure 3B:
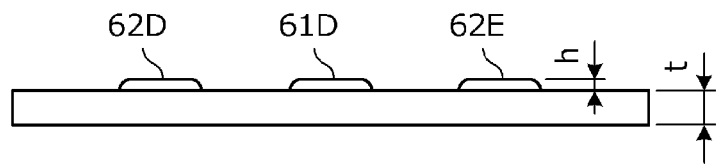
FIG. 3(B) is a front view of the capacitor 102.

FIG. 3(A) is a plan view of a capacitor 102 according to the second embodiment. FIG. 3(B) is a front view of the capacitor 102. The surface illustrated in FIG. 3(A) is a surface on the side that is to be mounted on a circuit board (mounting surface). The capacitor 102 includes first terminal electrodes 61A, 61B, 61C and 61D, and second terminal electrodes 62A, 62B, 62C, 62D and 62E. The dimensions of the various parts of the capacitor 102 are as follows, for example.

X: 0.75 mm
Y: 0.75 mm
P: 0.2 mm
S: 0.1 mm
t: 0.04 mm
h: 0.02 mm

The capacitor 102 is an element that has a prescribed capacitance between the first terminal electrodes 61A, 61B, 61C and 61D and the second terminal electrodes 62A, 62B, 62C, 62D and 62E, and is used as a decoupling capacitor, for example.

Figure 4:
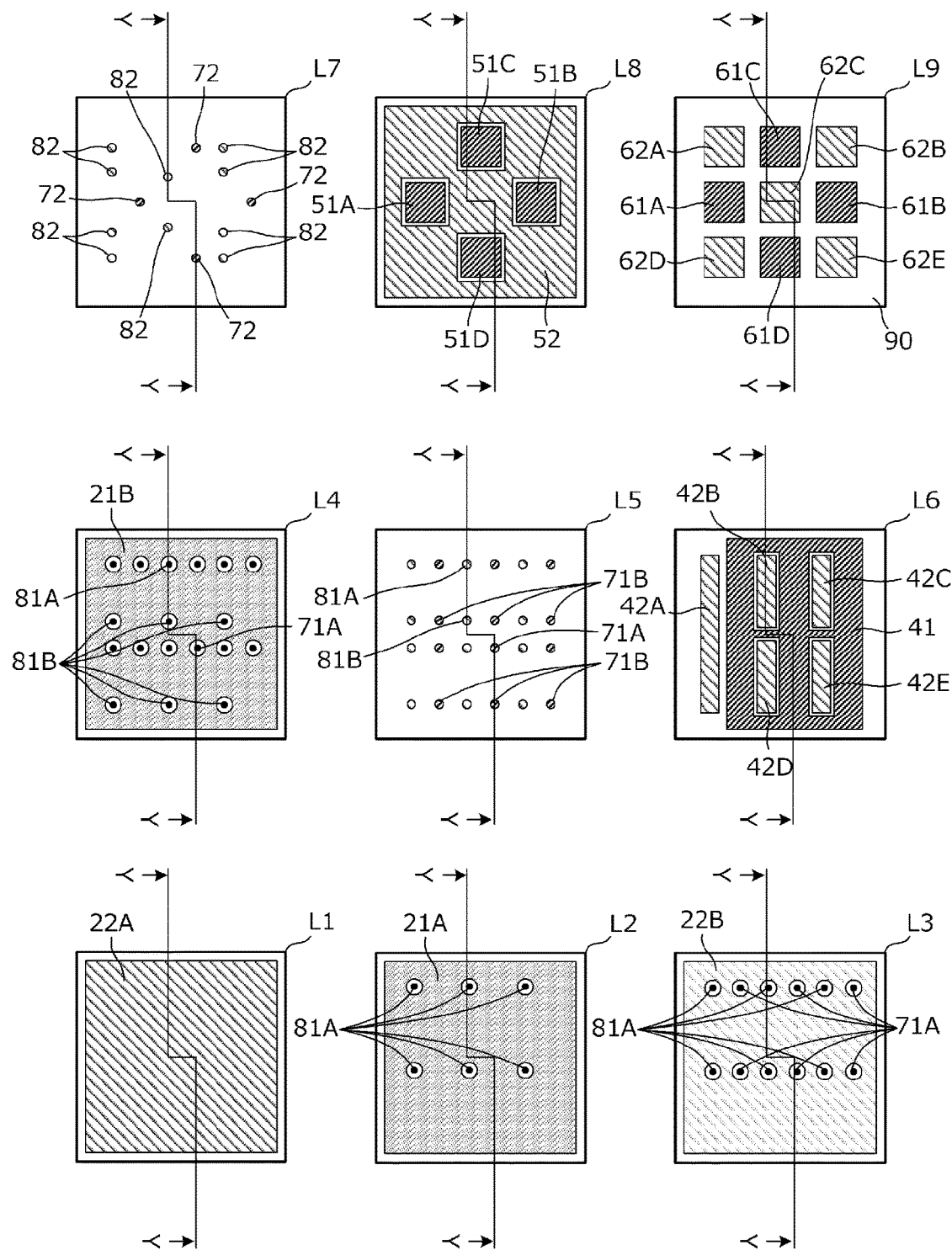
FIG. 4 is a plan view of some layers of the capacitor 102.
Figure 5:
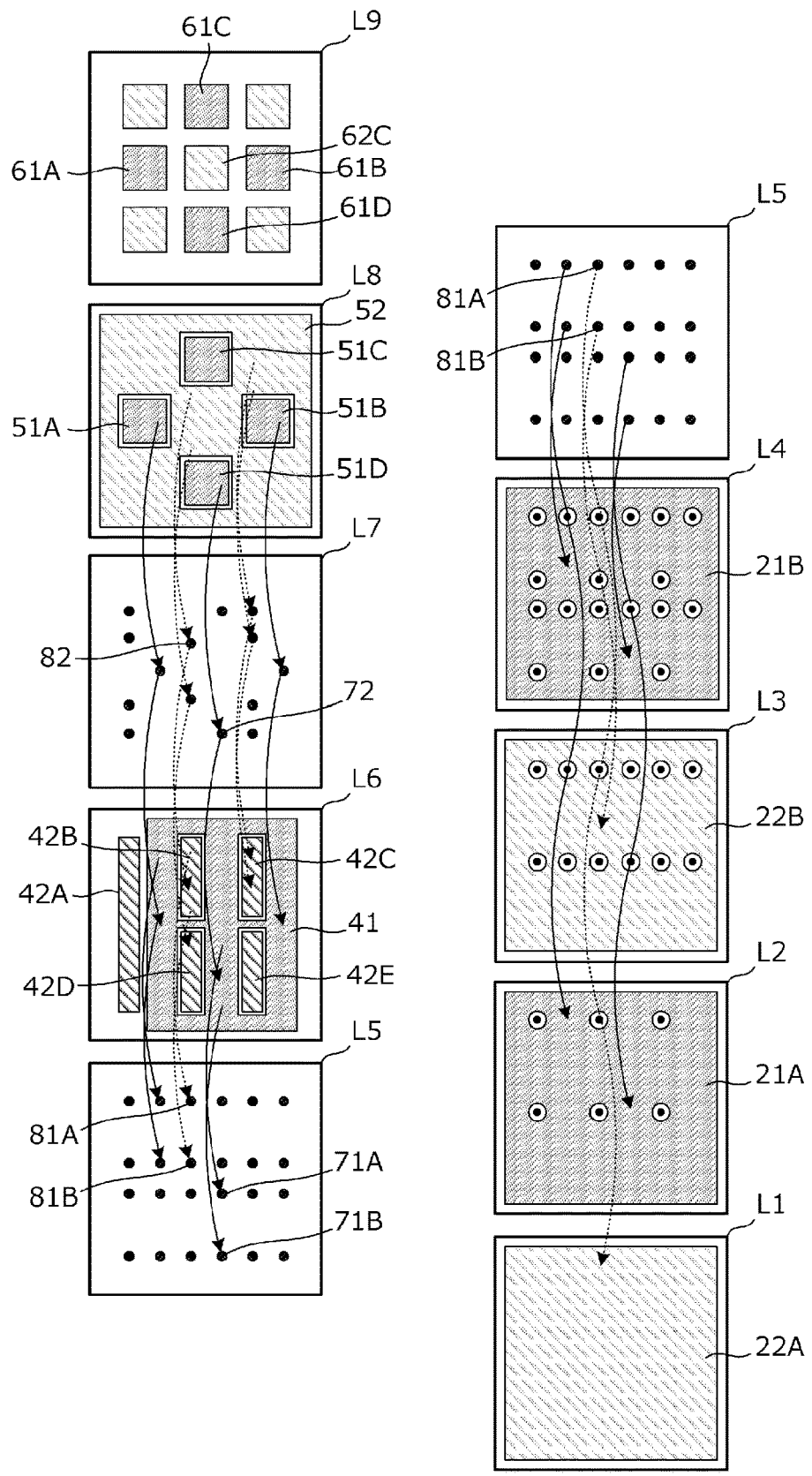
FIG. 5 is an exploded plan view illustrating the connection relationships between the electrodes and conductors of the respective layers of the capacitor 102.
Figure 6:
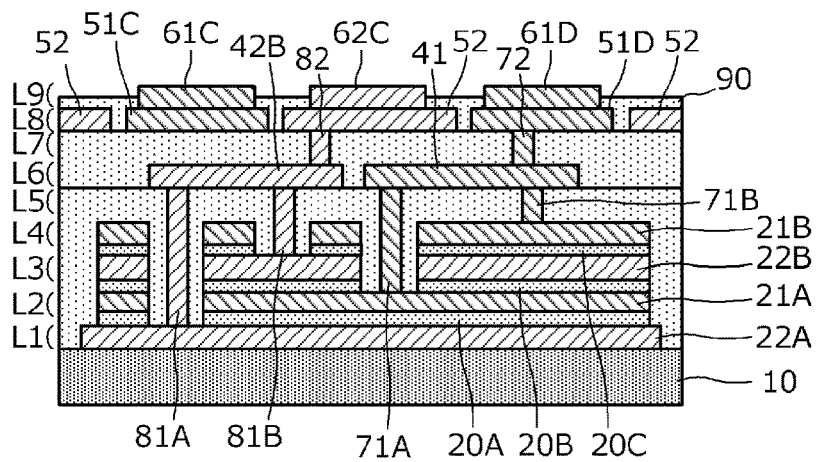
FIG. 6 is a sectional view taken along Y-Y in FIG. 4.

FIG. 4 is a plan view of some of the layers of the capacitor 102. FIG. 5 is an exploded plan view illustrating the connection relationships between the electrodes and conductors of the respective layers of the capacitor 102. FIG. 6 is a sectional view taken along Y-Y in FIG. 4. In FIGS. 4 and 5, illustration of dielectric layers, which are described later, is omitted.

As illustrated in FIGS. 4, 5 and 6, first inner electrodes 21A and 21B are formed on layers L2 and L4, and second inner electrodes 22A and 22B are formed on layers L1 and L3. A first intermediate electrode 41 and second intermediate electrodes 42A, 42B, 42C, 42D and 42E are formed on a layer L6. First surface electrodes 51A, 51B, 51C and 51D and a second surface electrode 52 are formed on a layer L8. The first terminal electrodes 61A, 61B, 61C and 61D and the second terminal electrodes 62A, 62B, 62C, 62D and 62E are formed on a layer L9.

An interlayer connection conductor 81A that connects the second inner electrode 22A and the second intermediate electrode 42B to each other is formed between the layer L1 and the layer L6. An interlayer connection conductor 71A that connects the first inner electrode 21A and first intermediate electrode 41 to each other is formed between the layer L2 and the layer L6. Interlayer connection conductors 81B that connect the second inner electrode 22B and the second intermediate electrodes 42A, 42B, 42C, 42D and 42E to each other are formed between the layer L3 and the layer L6. Interlayer connection conductors 71B that connect the first inner electrode 21B and the first intermediate electrode 41 to each other are formed in the layer L5.

In addition, interlayer connection conductors 72 that connect the first intermediate electrode 41 and the first surface electrodes 51A, 51B, 51C and 51D to each other, and interlayer connection conductors 82 that connect the second intermediate electrodes 42A, 42B, 42C, 42D and 42E and the second surface electrode 52 to each other are formed in the layer L7.

The first terminal electrodes 61A, 61B, 61C and 61D are formed on the surfaces of the first surface electrodes 51A, 51B, 51C and 51D. The second terminal electrodes 62A, 62B, 62C, 62D and 62E are formed on the surfaces of the second surface electrode 52.

The basic configurations of a first capacitor part and a second capacitor part of the capacitor 102 are the same as those illustrated in FIG. 2 in the first embodiment.

In the second embodiment, the first intermediate electrode 41 connects the plurality of first surface electrodes 51A, 51B, 51C and 51D to each other. In addition, the second intermediate electrodes 42A, 42B, 42C, 42D and 42E connect a plurality of locations on the second inner electrodes 22A and 22B to each other.

Thus, the plurality of first surface electrodes 51A, 51B, 51C and 51D are connected to each other by the first intermediate electrode 41, and the second inner electrodes 22A and 22B are connected to each other and connected to the second surface electrode 52 by the second intermediate electrodes 42A, 42B, 42C, 42D and 42E. Therefore, the effect of the directions of the currents flowing into and out of the first terminal electrodes 61A, 61B, 61C and 61D and the second terminal electrodes 62A, 62B, 62C, 62D and 62E is reduced. In other words, biasing (skewing) of the potential of the first surface electrodes 51A, 51B, 51C and 51D is reduced by the first intermediate electrode 41, and therefore the concentration of current within the planes of the first inner electrodes 21A and 21B is reduced. In addition, the biasing (skewing) of the potential of the second inner electrodes 22A and 22B is reduced by the second intermediate electrodes 42A, 42B, 42C, 42D and 42E, and therefore the concentration of current within the planes of the second inner electrodes 22A and 22B is reduced. Consequently, ESL and ESR are reduced. In addition, the number of current paths having a parallel relationship among current paths from the first inner electrodes 21A and 21B to the first surface electrodes 51A, 51B, 51C and 51D is increased, and the number of current paths having a parallel relationship among current paths from second inner electrodes 22A and 22B to the second surface electrode 52 is increased, and therefore ESL and ESR are reduced even more.

Figure 7:
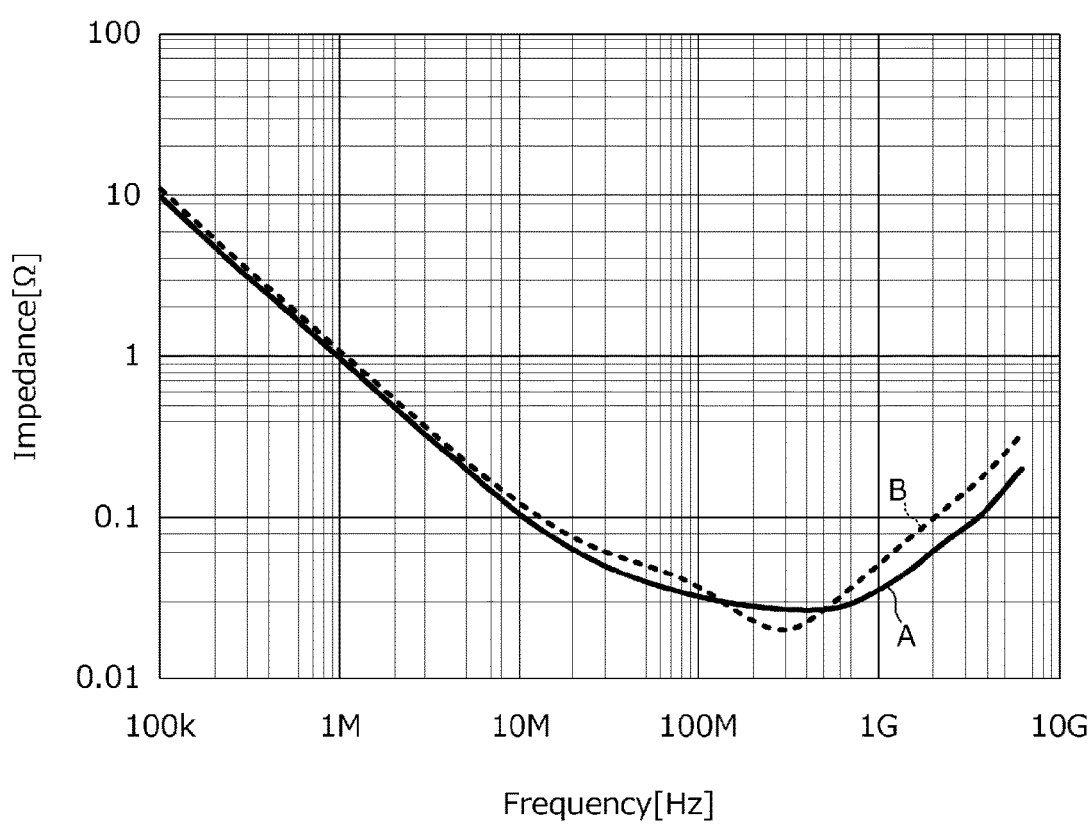
FIG. 7 illustrates frequency characteristics of the impedance of the capacitor 102.

FIG. 7 illustrates the frequency characteristics of the impedance of the capacitor 102. In FIG. 7, a characteristic curve A illustrates characteristics of the capacitor 102, and characteristic curve B illustrates characteristics of a comparative example. The comparative example is a capacitor having a structure in which the first intermediate electrode 41 and the second intermediate electrodes 42A, 42B, 42C, 42D and 42E are not provided. The shapes of the mounting electrodes on the circuit board side are the same as those illustrated in FIG. 1.

According to the capacitor 102 of this embodiment, a lower impedance is obtained around a frequency of 300 MHz where ESL is dominant. The impedance at this frequency corresponds to ESL, and the ESL is around 4 pH. The ESL in the comparative example is 7 pH, and therefore an improvement of around 3 pH is obtained compared with the comparative example.

Third Embodiment

In a third embodiment, an example in which the shape of the interlayer connection conductors is different from in the first and second embodiments will be described.

Figure 8A:
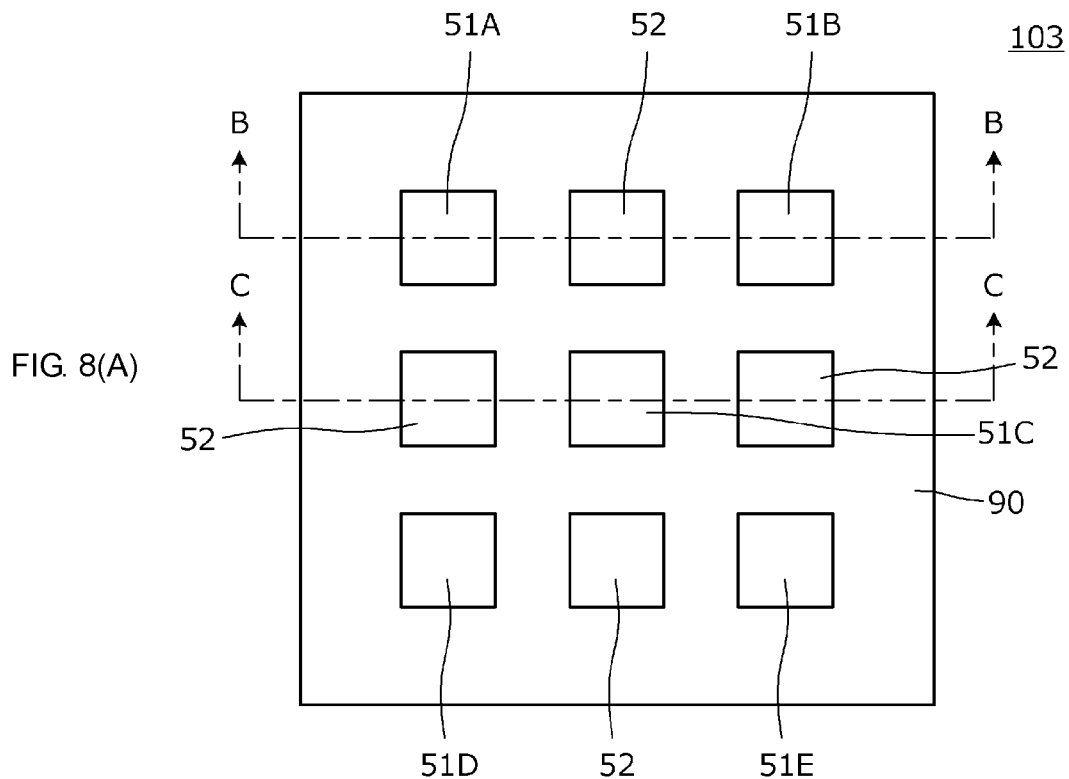
FIG. 8(A) is a plan view of a capacitor 103 according to a third embodiment.
Figure 8B:
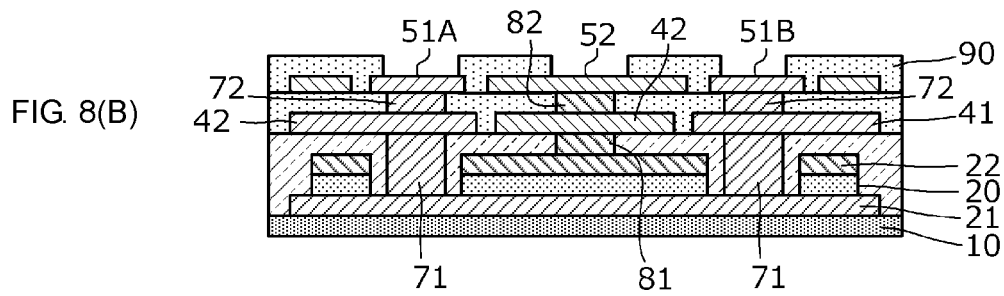
FIG. 8(B) is a sectional view taken along B-B in FIG. 8(A).
Figure 8C:
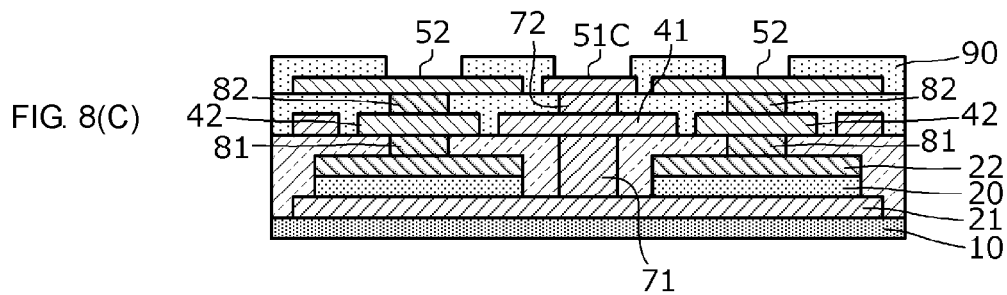
FIG. 8(C) is a sectional view taken along C-C in FIG. 8(A).
Figure 9:
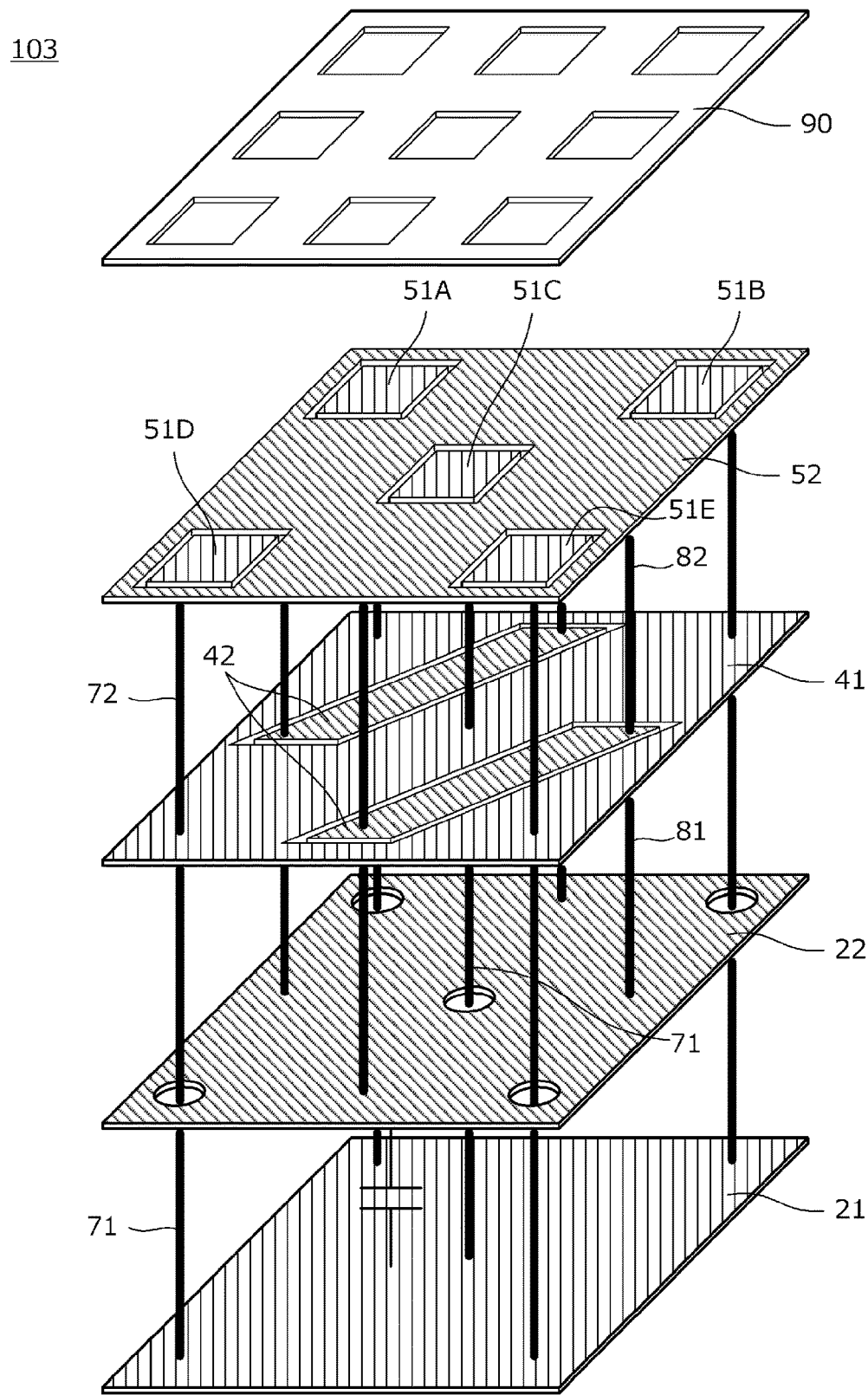
FIG. 9 is a schematic exploded perspective view of the capacitor 103.

FIG. 8(A) is a plan view of a capacitor 103 according to the third embodiment. FIG. 8(B) is a sectional view taken along B-B in FIG. 8(A). FIG. 8(C) is a sectional view taken along C-C in FIG. 8(A). FIG. 9 is a schematic exploded perspective view of the capacitor 103.

The capacitor 103 includes a substrate 10, a first inner electrode 21 and a second inner electrode 22 that are formed above a first main surface of the substrate 10, a dielectric layer 20 that is provided between the first inner electrode 21 and the second inner electrode 22, a first intermediate electrode 41 that is provided above the first inner electrode 21 and the second inner electrode 22, and that is connected to the first inner electrode 21 at a plurality of locations, two second intermediate electrodes 42 that are provided above the first inner electrode 21 and the second inner electrode 22, and are connected to the second inner electrode 22 at a plurality of locations, first surface electrodes 51A, 51B, 51C, 51D and 51E that are provided above the first intermediate electrode 41, and are electrically connected to the first intermediate electrode 41, a second surface electrode 52 that is provided above the second intermediate electrodes 42, and is connected to the second intermediate electrodes 42 at a plurality of locations, and a solder resist film 90 that is formed on the surfaces of the first surface electrodes 51A, 51B, 51C, 51D and 51E and the second surface electrode 52, and has openings therein at prescribed locations.

In FIGS. 8(B) and 8(C), a capacitor part is formed by the first inner electrode 21, the second inner electrode 22 and the dielectric layer 20. In FIG. 9, this capacitor part is represented by the circuit symbol of a capacitor.

The first inner electrode 21 and the first intermediate electrode 41 are connected to each other by interlayer connection conductors 71, and the first intermediate electrode 41 and the first surface electrodes 51A, 51B, 51C, 51D and 51E are connected to each other by interlayer connection conductors 72. Furthermore, the second inner electrode 22 and the second intermediate electrodes 42 are connected to each other by interlayer connection conductors 81, and the second intermediate electrodes 42 and the second surface electrode 52 are connected to each other by interlayer connection conductors 82.

The first intermediate electrode 41 connects the plurality of first surface electrodes 51A, 51B, 51C, 51D and 51E to each other. In addition, the second intermediate electrodes 42 connect the second surface electrode 52 and the second inner electrode 22 to each other at a plurality of locations. Due to this structure, similarly to as in the second embodiment, biasing (skewing) of the potential of the first surface electrodes 51A, 51B, 51C, 51D and 51E is reduced by the first intermediate electrode 41, and therefore the concentration of current within the plane of the first inner electrode 21 is reduced. Furthermore, the concentration of current within the planes of the second surface electrode 52 and the second inner electrode 22 is reduced. Consequently, ESL and ESR are reduced.

The outer shapes of the first inner electrode 21 and the second inner electrode 22 are substantially the same as each other, and the first intermediate electrode 41 is electrically connected to the first inner electrode 21 via openings provided in the second inner electrode 22. Thus, the path lengths of conductors that connect the first inner electrode 21 and the first intermediate electrode 41 to each other are short, and path lengths from the first intermediate electrode 41 to the first surface electrodes 51A, 51B, 51C, 51D and 51E in the thickness direction are short.

The second intermediate electrodes 42 are surrounded by the first intermediate electrode 41 along a common plane, and the first surface electrodes 51A, 51B, 51C, 51D and 51E are surrounded by the second surface electrode 52 along a common plane (e.g., a plane of the second surface electrode 52). Thus, the current that flows in the first inner electrode 21, the second inner electrode 22 and the second surface electrode 52 is distributed in the planar directions by using a small number of layers.

Although an example is illustrated in FIGS. 8(A), 8(B) and 8(C), and FIG. 9 in which the first surface electrodes 51A, 51B, 51C, 51D and 51E and the second surface electrode 52 are exposed at the uppermost surface, alternatively, first terminal electrodes may be formed on the upper surfaces of the first surface electrodes and second terminal electrodes may be formed on the upper surface of the second surface electrode, similarly to as in the second embodiment.

In addition, as in this embodiment, provided that a structure is adopted in which interlayer connection conductors are provided separately from the first and second intermediate electrodes, the individual layers may be formed using a thick film process rather than a thin film process.

Other Embodiments

Although the first intermediate electrode and the second intermediate electrode are each formed in one layer in the above-described embodiments, either or both of the first intermediate electrode and the second intermediate electrode may instead be formed across a plurality of layers. In addition, the first intermediate electrode and the second intermediate electrode may be formed in different layers.

In the above-described embodiments, although the total number of first surface electrodes and second surface electrodes is an odd number and the relationship of $n2=n1+1$ is satisfied where n1 is the number of first surface electrodes and n2 is the number of second surface electrodes, the number of first surface electrodes may instead be greater than the number of second surface electrodes.

In addition, either of the first surface electrodes and the second surface electrodes may be connected to a power supply line, and either of the first surface electrodes and the second surface electrodes may be connected to a ground electrode. However, it is preferable that they be selected so as to obtain the shorter connection path from the mounting electrodes on the circuit board, which is a mounting target, to the power supply line, and the shorter path from the mounting electrodes to the ground electrode are short.

In the above-described embodiments, a capacitor is formed in a rectangular parallelepiped shaped substrate, first surface electrodes and second surface electrodes are arranged in a planar grid-like pattern, and the planar grid-like pattern is a square grid-like pattern in which one side of the flat grid extends along one side of the parallelepiped shape, but the orientation of the flat grid with respect to the rectangular parallelepiped shaped substrate is not limited to this orientation. For example, a diagonal grid-like pattern or an equilateral triangle grid-like pattern may be adopted instead.

Finally, the descriptions of the above embodiments are to be thought of as being illustrative in all points and not restrictive. Modifications and changes can be made by those skilled in the art, as appropriate. For example, parts of the configurations described in the different embodiments can be substituted for one another or combined with each other. The scope of the present invention is defined by the following claims rather than by the above-described embodiments. Furthermore, changes to embodiments that are within the scope of the claims or within the scope of equivalents to the scope of the claims are included in the scope of the present invention.

REFERENCE SIGNS LIST

L1 to L9 . . . layer
10 . . . substrate
11 . . . adhesive layer
20, 20A, 20B, 20C . . . dielectric layer
21, 21A, 21B . . . first inner electrode
22, 22A, 22B . . . second inner electrode
30 . . . inorganic insulating layer
31 . . . first organic protective layer
32 . . . second organic protective layer
33 . . . third organic protective layer
41 . . . first intermediate electrode 42, 42A, 42B, 42C, 42D, 42E . . . second intermediate electrode
51, 51A, 51B, 51C, 51D, 51E . . . first surface electrode
52 . . . second surface electrode
61A, 61B, 61C, 61D, 61E . . . first terminal electrode
62A, 62B, 62C, 62D, 62E . . . second terminal electrode
71, 72, 81, 82 . . . interlayer connection conductor
90 . . . solder resist
101, 102, 103 . . . capacitor
161A, 161B, 161C, 161D, 161E . . . first mounting electrode
162A, 162B, 162C, 162D . . . second mounting electrode
200 . . . circuit board
211 to 218, 221 to 228 . . . wiring line
300 . . . semiconductor integrated circuit

The invention claimed is:

1. A capacitor comprising:
a substrate having a first main surface;
a first inner electrode and a second inner electrode disposed above a side of the first main surface, the second inner electrode being arranged so as to face the first inner electrode;
a dielectric layer between the first inner electrode and the second inner electrode;
a first intermediate electrode connected to the first inner electrode at a plurality of first locations;
a plurality of first surface electrodes which are each electrically connected to the first intermediate electrode; and
a second surface electrode electrically connected to the second inner electrode at a plurality of second locations,
wherein a first layer of the capacitor containing the first inner electrode and a second layer of the capacitor containing the first intermediate electrode have different electrode patterns.

2. The capacitor according to claim 1, wherein the first inner electrode and the second inner electrode have a same outer shape, and the first intermediate electrode is electrically connected to the first inner electrode at the plurality of first locations via a respective plurality of openings in the second inner electrode.

3. The capacitor according to claim 1, further comprising a second intermediate electrode electrically connected to the second inner electrode at a plurality of third locations.

4. The capacitor according to claim 3, wherein the second intermediate electrode is surrounded by the first intermediate electrode, and the plurality of first surface electrodes are surrounded by the second surface electrode.

5. The capacitor according to claim 4, wherein the second intermediate electrode is on a first common plane with the first intermediate electrode, and the plurality of first surface electrodes are surrounded by the second surface electrode in a second common plane.

6. The capacitor according to claim 1, wherein the plurality of first surface electrodes are arranged in a planar grid pattern in which the plurality of first surface electrodes are arranged so as to alternate with the second surface electrode in a horizontal direction and a vertical direction.

7. The capacitor according to claim 1, wherein the first intermediate electrode has a lower sheet resistance than the first inner electrode.

8. The capacitor according to claim 1, wherein the substrate is a semiconductor substrate, and the first inner electrode, the second inner electrode, the first intermediate electrode, the first surface electrodes and the second surface electrode are metal films.

9. The capacitor according to claim 8, wherein the dielectric layer is a BST film layer.

10. The capacitor according to claim 9, wherein the first inner electrode and the second inner electrode include a metal having Pt as a main component thereof.

11. The capacitor according to claim 10, wherein the first intermediate electrode includes a metal having Cu or Al as a main component thereof.

12. The capacitor according to claim 1, wherein the first intermediate electrode includes a metal having Cu or Al as a main component thereof.

13. The capacitor according to claim 1, further comprising a metal film having Cu as a main component thereof on a surface of each of the plurality of first surface electrodes and the second surface electrode.

14. An electronic device comprising:
a circuit board including at least one first mounting electrode and at least one second mounting electrode; and
a capacitor according to claim 1 mounted on the circuit board such that the plurality of first surface electrodes are electrically connected to the at least one first mounting electrode and the second surface electrode is electrically connected to the at least one second mounting electrode.

15. The electronic device according to claim 14, further comprising:
an integrated circuit provided in or on the circuit board; and
a power supply circuit provided in or on the circuit board and arranged to supply a voltage to the integrated circuit,
wherein the capacitor is configured as a decoupling capacitor connected between a power supply terminal of the integrated circuit and a ground.

16. The electronic device according to claim 14, wherein the first inner electrode and the second inner electrode have a same outer shape, and the first intermediate electrode is electrically connected to the first inner electrode at the plurality of first locations via a respective plurality of openings in the second inner electrode.

17. The electronic device according to claim 14, further comprising a second intermediate electrode electrically connected to the second inner electrode at a plurality of third locations.

18. The electronic device according to claim 17, wherein the second intermediate electrode is surrounded by the first intermediate electrode, and the plurality of first surface electrodes are surrounded by the second surface electrode.

19. The electronic device according to claim 18, wherein the second intermediate electrode is on a first common plane with the first intermediate electrode, and the plurality of first surface electrodes are surrounded by the second surface electrode in a second common plane.

20. The electronic device according to claim 14, wherein the first intermediate electrode has a lower sheet resistance than the first inner electrode.

* * * * *